(12) United States Patent
Liu et al.

(10) Patent No.: US 7,888,218 B2
(45) Date of Patent: Feb. 15, 2011

(54) USING THICK SPACER FOR BITLINE IMPLANT THEN REMOVE

(75) Inventors: Zhizheng Liu, San Jose, CA (US); Shankar Sinha, Redwood Shores, CA (US); Timothy Thurgate, Sunnyvale, CA (US); Ming-Sang Kwan, San Leandro, CA (US)

(73) Assignee: Spansion LLC, Sunnyvale, CA (US)

( * ) Notice: Subject to any disclaimer, the term of this patent is extended or adjusted under 35 U.S.C. 154(b) by 780 days.

(21) Appl. No.: 11/724,775

(22) Filed: Mar. 16, 2007

(65) Prior Publication Data
US 2008/0153223 A1      Jun. 26, 2008

Related U.S. Application Data

(60) Provisional application No. 60/876,181, filed on Dec. 20, 2006.

(51) Int. Cl.
*H01L 21/336* (2006.01)

(52) U.S. Cl. ............ 438/287; 257/E21.18; 257/E21.21; 257/E21.423; 257/E21.679; 438/216

(58) Field of Classification Search ............ 257/E21.18, 257/E21.21, E21.423, E21.679, 324, E29.309; 438/216, 287
See application file for complete search history.

(56) References Cited

U.S. PATENT DOCUMENTS

| | | | | |
|---|---|---|---|---|
| 7,414,277 B1 * | 8/2008 | Melik-Martirosian et al. | .... | 257/288 |
| 2005/0051833 A1 * | 3/2005 | Wang et al. | ................. | 257/315 |
| 2005/0255651 A1 * | 11/2005 | Qian et al. | ................... | 438/257 |
| 2005/0264400 A1 * | 12/2005 | Fisher | ........................ | 340/5.73 |
| 2006/0084219 A1 * | 4/2006 | Lusky et al. | ................ | 438/201 |
| 2006/0211188 A1 * | 9/2006 | Lusky et al. | ................ | 438/201 |
| 2006/0261418 A1 * | 11/2006 | Eitan et al. | ................... | 257/390 |
| 2007/0004135 A1 * | 1/2007 | Chindalore | ................. | 438/257 |
| 2008/0135902 A1 * | 6/2008 | Sinha et al. | ................. | 257/296 |
| 2008/0153274 A1 * | 6/2008 | Thurgate et al. | ............ | 438/526 |

\* cited by examiner

*Primary Examiner*—Anh Phung
*Assistant Examiner*—Michael Lulis
(74) *Attorney, Agent, or Firm*—Eschweiler & Associates, LLC

(57) ABSTRACT

The present invention pertains to a system method of forming at least a portion of a dual bit memory core array upon a semiconductor substrate, the method comprising forming adjacent first memory cell process assemblies; comprising a charge trapping dielectric, a first polysilicon layer and defining a first bitline opening there between, forming first polysilicon layer features over the charge trapping dielectric layer, depositing a layer of second spacer material over the charge trapping dielectric and the first polysilicon layer features, forming a sidewall spacer adjacent to the charge trapping dielectric and the first polysilicon layer features to define a second bitline opening between the adjacent memory cells, performing a bitline implant, or pocket implants, or both into the bitline opening to establish buried bitlines within the substrate having respective bitline widths that are narrower than the respective widths of the first bitline openings, removing the sidewall spacers, and performing back end processing.

13 Claims, 16 Drawing Sheets

USING THICK SPACER FOR BITLINE IMPLANT THEN REMOVE

REFERENCE TO RELATED APPLICATION

This application claims the benefit of U.S. Provisional Patent Application Ser. No. 60/876,181 which was filed Dec. 20, 2006, entitled USING THICK SPACER FOR BITLINE IMPLANT THEN REMOVE.

FIELD OF INVENTION

The present invention relates generally to memory devices and the like, and in particular to fabricating dual bit memory devices by using a removable thick spacer to lower the bitline resistance, thus improving short channel effect/properties.

BACKGROUND OF THE INVENTION

Many different types of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc., as well as in many larger electronic systems, such as cars, planes, industrial control systems, etc. Flash memory is generally constructed of many memory cells where single bits of data are stored in and read from respective memory cells.

Individual memory cells are generally organized into individually addressable units or groups, which are accessed for read, program, or erase operations through address decoding circuitry. The individual memory cells are typically comprised of a semiconductor structure adapted for storing a bit of data. For instance, many conventional memory cells include a stacked gate metal oxide semiconductor (MOS) device, such as a transistor in which a binary piece of information may be retained. The memory device includes appropriate decoding and group selection circuitry, as well as circuitry to provide voltages to the cells being operated on.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

The traditional memory cell generally has a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multi-layer insulator such as an oxide-nitride-oxide (ONO) layer having two oxide layers sandwiching a nitride layer. Lastly, a polysilicon control gate overlies the interpoly dielectric layer.

In a NOR configuration, the control gate is connected to a wordline associated with a row of memory cells to form sectors of such cells. In addition, the drain regions of the cells are connected together by a conductive bitline. The channel of the cell conducts current between the source and the drain in accordance with an electric field developed in the channel by the stacked gate structure. Respective drain terminals of the transistors within a single column are connected to the same bitline. In addition, respective flash cells associated with a given bitline have stacked gate terminals coupled to a different wordline, while all the flash cells in the array generally have their source terminals coupled to a common source terminal. In operation, individual flash cells are addressed via the respective bitline and wordline using the peripheral decoder and control circuitry for programming (writing), reading or erasing functions.

By way of further detail, the single bit stacked gate flash memory cell is programmed by applying a relatively high voltage to the control gate and connecting the source to ground and the drain to a predetermined potential above the source. A resulting high electric field across the tunnel oxide leads to the Fowler-Nordheim tunneling phenomena. During this process, electrons in the core cell channel region tunnel through the gate oxide into the floating gate and become trapped in the floating gate since the floating gate is surrounded by the interpoly dielectric and the tunnel oxide. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell, a relatively high voltage is applied to the source, and the control gate is held at a negative potential, while the drain is allowed to float. Under these conditions, a strong electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

For a read operation, a certain voltage bias is applied across the drain to source of the cell transistor. The drain of the cell is the bitline, which may be connected to the drains of other cells in a byte or word group. The voltage at the drain in conventional stacked gate memory cells is typically provided at between 0.5 and 1.0 volts in a read operation. A voltage is then applied to the gate (e.g., the wordline) of the memory cell transistor in order to cause a current to flow from the drain to source. The read operation gate voltage is typically applied at a level between a programmed threshold voltage (Vt) and an unprogrammed threshold voltage. The resulting current is measured, by which a determination is made as to the data value stored in the cell.

A modern memory technology is dual bit memory, which allows multiple bits to be stored in a single cell. In this technology, a memory cell is essentially split into two identical (mirrored) parts, each of which is formulated for storing one of two independent bits. Each dual bit memory cell, like a traditional cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit the storing of two bits.

In a virtual ground type architecture, dual bit memory cells have a semiconductor substrate with implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Programming circuitry controls two bits per cell by applying a signal to the wordline, which acts as a control gate, and changing bitline connections such that one bit is stored by the source and drain being connected in one arrangement and a complementary bit is stored by the source and drain being connected in another arrangement.

A continuing trend in the electronics industry is to scale down electronic devices to produce smaller, yet more powerful devices (e.g., cell phones, digital cameras, etc.) that can perform a greater number of increasingly complex functions faster and with less power. To achieve this, semiconductors and integrated circuits (e.g., memory cells, transistors, etc.) utilized in these devices are continually reduced in size. The ability to "pack" more of these components onto a single semiconductor substrate, or a portion thereof (known as a die), also improves fabrication efficiency and yields. Accordingly, there are ongoing efforts to, among other things, increase the number of memory cells that can be fabricated onto individual semiconductor wafers (or die).

One technique to pack more memory cells/transistors into a smaller area is to form their structures and component elements closer together by utilizing photo-resist processes. However, photo-resist introduces well known problems, for example, in order to perform high energy implants the bitline width becomes larger than desired. Forming bitlines closer together, for example, shortens the length of a channel defined there-between and allows more devices to be formed in the same area however, the short channel width and the wide bitline cause certain phenomena to become more prevalent and have a substantial impact on device performance. For example, threshold voltage roll-off may become more pronounced as respective channel lengths are decreased. In particular, a threshold voltage (Vt), or voltage at which a transistor or memory cell "turns on" or becomes active to store and/or erase a bit of data (e.g., a charge), may vary (e.g., become reduced) as the respective channel length is decreased (e.g., source and drain regions are brought closer together). Additionally, the severity of threshold voltage roll-off may vary among different memory cells. In this manner, not all of a selected group of memory cells may be programmed/erased when the same or a similar voltage is applied to the cells. This could result in corrupt data and/or inaccurately stored or programmed data. Another issue is program disturb (TPD) which occurs, for example, when we program one device, another adjacent device also programs. This again results in inaccurately stored or programmed data.

Similarly, other issues, such as leakage currents, cross talk, etc., can also result from scaling. For example, isolating two bits or charges stored in a charge trapping layer becomes increasingly difficult as the channel length is decreased and the bits are brought closer together. In this manner, cross-talk and punch through currents can occur, the bits can contaminate one another and operations performed on one bit can affect the other bit (sometimes referred to complimentary bit disturb or CBD). Accordingly, it would be desirable to reduce feature sizes so as to increase packing density while mitigating the adverse affects that may result there-from, such as Vt roll-off, PD and CBD.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention pertains to implementing a dual poly process in forming a transistor based memory device. The process utilizes a removable thick spacer which allows higher energy implant of bitlines allowing a deeper bitline implant without creating as wide of a bitline as conventional techniques. The damaged spacer can then be removed and a new oxide material can be formed over the buried bitlines to improve (e.g., increase) breakdown voltage between the bitlines and wordlines, thus allowing for greater discrimination between programming and erasing charges and more reliable data storage. The process also facilitates a reduction in buried bitline width and thus allows bitlines to be formed closer together. As a result, more devices can be "packed" within the same or a smaller area.

According to one or more aspects of the present invention, a method of forming at least a portion of a dual bit memory core array upon a semiconductor substrate is disclosed. The method includes forming a charge trapping dielectric layer over the substrate and forming a first polysilicon layer over the charge trapping dielectric layer. A hardmask is formed over the first poly layer and is patterned to form hardmask features having respective first spacings there-between. The first spacings have respective first widths. A first layer of spacer material is then formed over the hardmask features and is patterned to form first sidewall spacers adjacent to the hardmask features. Respective pairs of the first sidewall spacers thereby define bitline openings. The first poly layer is then patterned to form second spacings therein, the second spacings having respective second widths substantially equal to respective widths of the bitline openings. The charge trapping dielectric layer is then patterned to form third spacings therein, the third spacings having respective third widths substantially equal to respective widths of the bitline openings. A second layer of thick spacer material is then formed over the first poly layer and the charge trapping dielectric layer features and is patterned to form second sidewall thick spacers adjacent to the hardmask features. Respective pairs of the second sidewall thick spacers thereby define bitline openings. A bitline implant is then performed through the bitline openings and the second and third spacings to establish buried bitlines within the substrate. The second sidewall thick spacers are removed with the buried bitlines have respective bitline widths that are narrower than the respective widths of the bitline openings. A high temperature oxide deposition is then performed to fill in the third spacings with one or more oxide based materials. Similarly, a high density plasma oxide deposition is subsequently performed to fill in the second spacings with one or more oxide based materials. A chemical mechanical polishing is then performed to remove excess oxide based materials. Finally, a second poly layer is formed over the charge trapping dielectric layer and is patterned to form wordlines over the buried bitlines.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
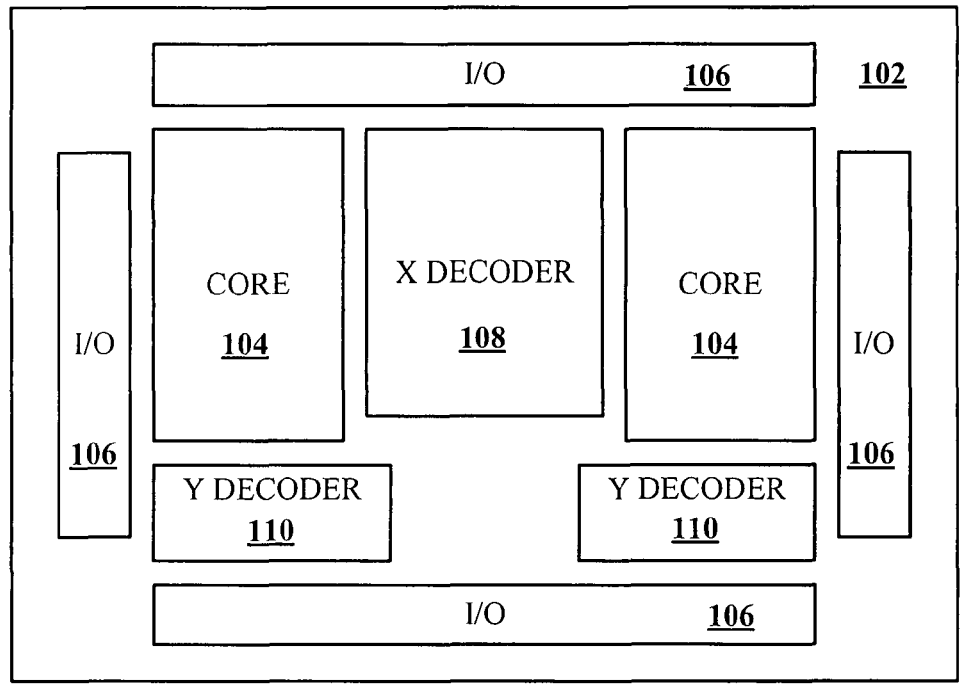
FIG. 1 is a top view of a dual bit flash memory device.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram or other form in order to facilitate describing one or more aspects of the present invention.

The present invention pertains to implementing a dual poly (polysilicon) process in forming a transistor based memory device. The process employs removable thick spacers that allow buried bitlines to be formed utilizing high implantation energy and deep implantation depths producing narrower bitlines than conventional bitlines in order to reduce short channel effects. Oxide materials are also formed over the buried bitlines to improve (e.g., increase) breakdown voltage between the bitlines and wordlines, thus allowing for greater discrimination between programming and erasing charges and more reliable resulting data storage. The process facilitates a reduction in buried bitline width allowing bitlines to be formed closer together. As a result, more devices can be "packed" within the same or a smaller area.

Referring initially to FIG. 1, a top view of an exemplary dual bit flash EEPROM 100 is illustrated. The memory 100 generally incorporates a semiconductor substrate 102 in which one or further high-density core regions 104 and one or more lower-density peripheral portions are formed. The high-density core regions characteristically include one or more M by N arrays 104 of individually addressable, substantially identical dual bit flash memory cells. The lower-density peripheral portions on the other hand typically include input/output (I/O) circuitry 106 and programming circuitry for selectively addressing the individual memory cells. The programming circuitry is represented in part by and includes one or more x-decoders 108 and one or more y-decoders 110 that collaborate with the I/O circuitry 106 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
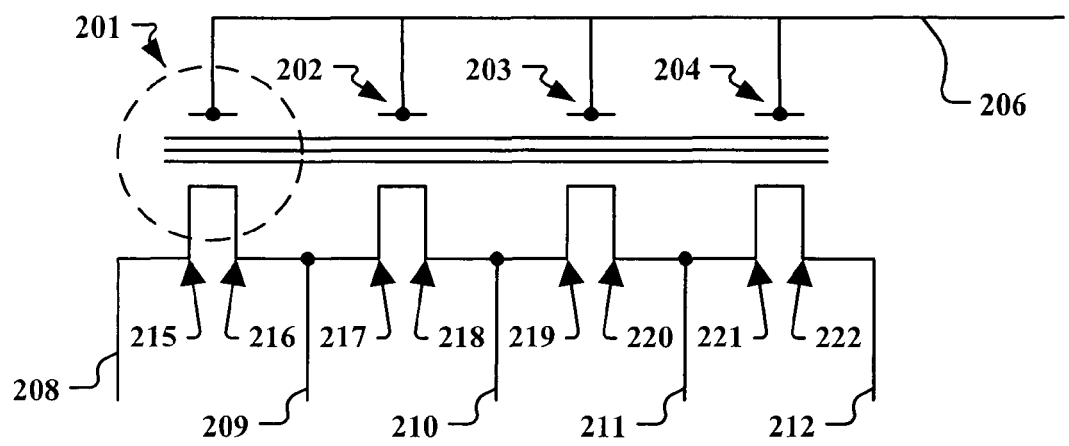
FIG. 2 is a schematic illustration of a portion of a wordline of a memory core such as may include at least part of one of the cores depicted in FIG. 1 in a virtual ground type architectural configuration.

Turning to FIG. 2, a schematic illustration is presented of a portion 200 of a memory core such as may include at least part of one of the M by N array cores 104 depicted in FIG. 1. The circuit schematic shows a line of memory cells, which includes memory cells 201 through 204 in a virtual ground type implementation, for example. The respective memory cells 201 through 204 are connected to a wordline 206, which serves as a control gate, and pairs of the memory cells share a common bitline. For instance, in the example shown, the memory cell 201 has associated bitlines 208 and 209; the memory cell 202 has associated bitlines 209 and 210; the memory cell 203 has associated bitlines 210 and 211; and the memory cell 204 has associated bitlines 211 and 212. As such, cells 201 and 202 share bitline 209, cells 202 and 203 share bitline 210 and cells 203 and 204 share bitline 211, respectively.

Depending upon a signal on the wordline and the connection of the bitlines in a memory cell to an electrical source or drain, the memory cells 201 through 204 are capable of writing, reading, and erasing bits at locations 215 through 222. For example, program of the bit at location 215 is achieved through connection of the drain to the bitline 208 and the source to the bitline 209. Similarly, program of the bit at location 216 is achieved through connection of the drain to the bitline 209 and the source to the bitline 208. It will be appreciated that although adjacent memory cells share common bitlines, the adjacent memory cells do not interfere with each other because the memory cells are typically programmed one at a time and in such instances only one memory cell is active at a time while programming.

Figure 3:
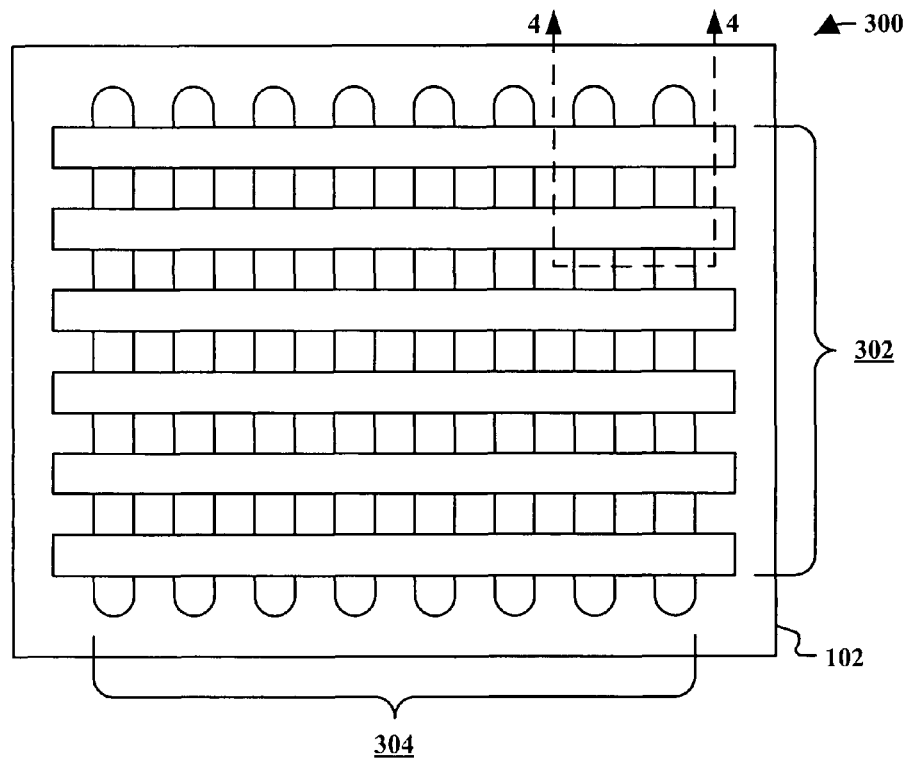
FIG. 3 is a top view of at least a portion of a memory core, such as may include at least part of one of the cores depicted in FIG. 1.

Referring now to FIG. 3, a top view is presented of at least a portion 300 of a memory core, such as may include at least part of one of the M by N array cores 104 depicted in FIG. 1. The memory 300 is formed upon a semiconductor substrate 102 and has a plurality of implanted bitlines 304 extending substantially parallel to one another, and further includes a plurality of formed wordlines 302 extending substantially in parallel to one another and at substantially right angles to the plurality of implanted bitlines 304. It will be appreciated that the wordlines 302 and bitlines 304 have contacts and interconnections (not shown) to programming circuitry such as may be represented, at least in part, by the x-decoders 108 and y-decoders 110 depicted in FIG. 1.

Figure 4:
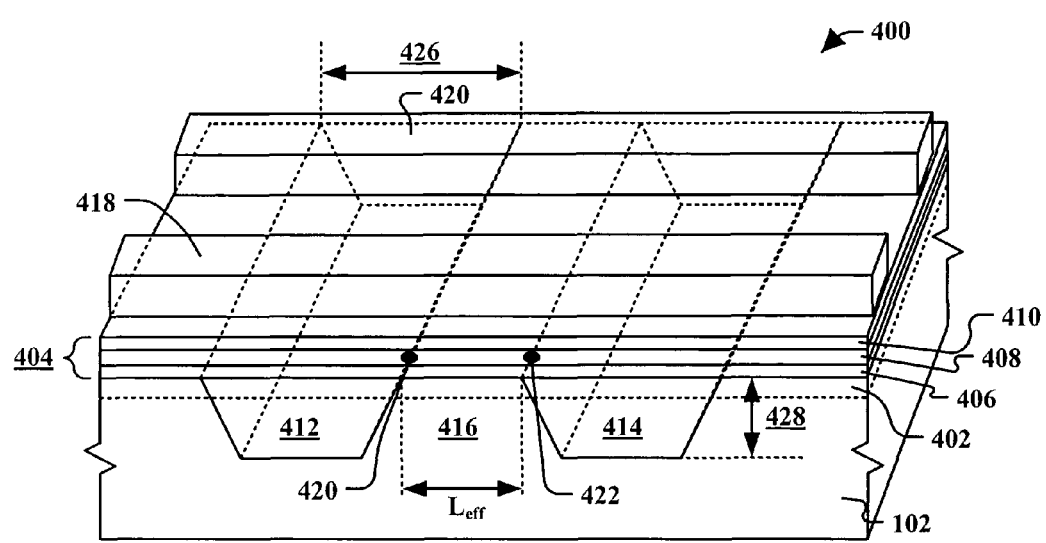
FIG. 4 is a cross-sectional isometric illustration of a portion of a dual bit flash memory, such as that taken along line 4-4 of FIG. 3.

FIG. 4 is a cross-sectional isometric illustration of a portion 400 of a dual bit flash memory, such as that taken along line 4-4 of FIG. 3. A semiconductor substrate 102 upon which the memory is formed is doped with a p-type impurity such as boron, for example, to establish a threshold adjustment implant ($V_{tadjust}$) region 402 therein. The threshold adjustment implant provides a region 402 that is more heavily doped than the semiconductor substrate 102. The substrate can, for example, be formed out of silicon and can itself be doped with a p-type impurity. The threshold adjustment implant 402 assists in controlling a threshold voltage of the various cells within the memory 400.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are typically formed of an oxide dielectric such as silicon dioxide ($SiO_2$) and the charge-trapping layer 408 is generally formed of a nitride dielectric such as silicon nitride ($Si_xN_y$). The oxide-nitride-oxide configuration is commonly referred to as an ONO layer for convenience. Alternatively, other types of charge-trapping layers may be employed and are contemplated as falling within the scope of the present invention.

First and second conductive bitlines 412 and 414 are depicted in FIG. 4 underlying the charge trapping dielectric layer 404. It will be appreciated that any number of such bitlines can be implanted into the semiconductor substrate 102, and that such bitlines may correspond to the bitlines 304 depicted in FIG. 3. The bitlines are typically formed of an implanted n-type material, such as arsenic, and may include an oxide portion (not shown) in some examples. The first and second conductive bitlines 412 and 414 are spaced apart and define a channel region 416 there-between.

First and second conductive wordlines 418, 420 are similarly depicted overlying the charge-trapping dielectric layer 404. It will be appreciated that any number of such wordlines can be formed over the dielectric layer 404, and that such wordlines may correspond to the wordlines 302 depicted in FIG. 3. The wordlines can be formed out of a polysilicon material, for example, where the polysilicon material may be deposited over the dielectric layer 404 and then patterned and etched.

Locations 420 and 422 indicate generally where respective bits of data can be stored in one or the cells of the memory 400. It will be appreciated that the channel 416 has an effective length $L_{eff}$ and that the bits 420, 422 will be brought closer together as this length is reduced (e.g., as a result of scaling). As such, the bits themselves may interfere with and/or contaminate one another and operations performed on one bit may affect the other bit should the bits get too close to one another.

In the example shown, the buried bitlines 412, 414 are formed to a width 426 and a depth 428. Conventionally, such a width 426 would be around 120 nanometers, while such a depth 428 would be on the order of around 800 Angstroms, for example. These dimensions coupled, primarily, with the electrical properties of the overlying ONO layer 404 produce a breakdown or threshold voltage (Vt) between the bitlines and wordlines of around 16 volts.

Figure 5:
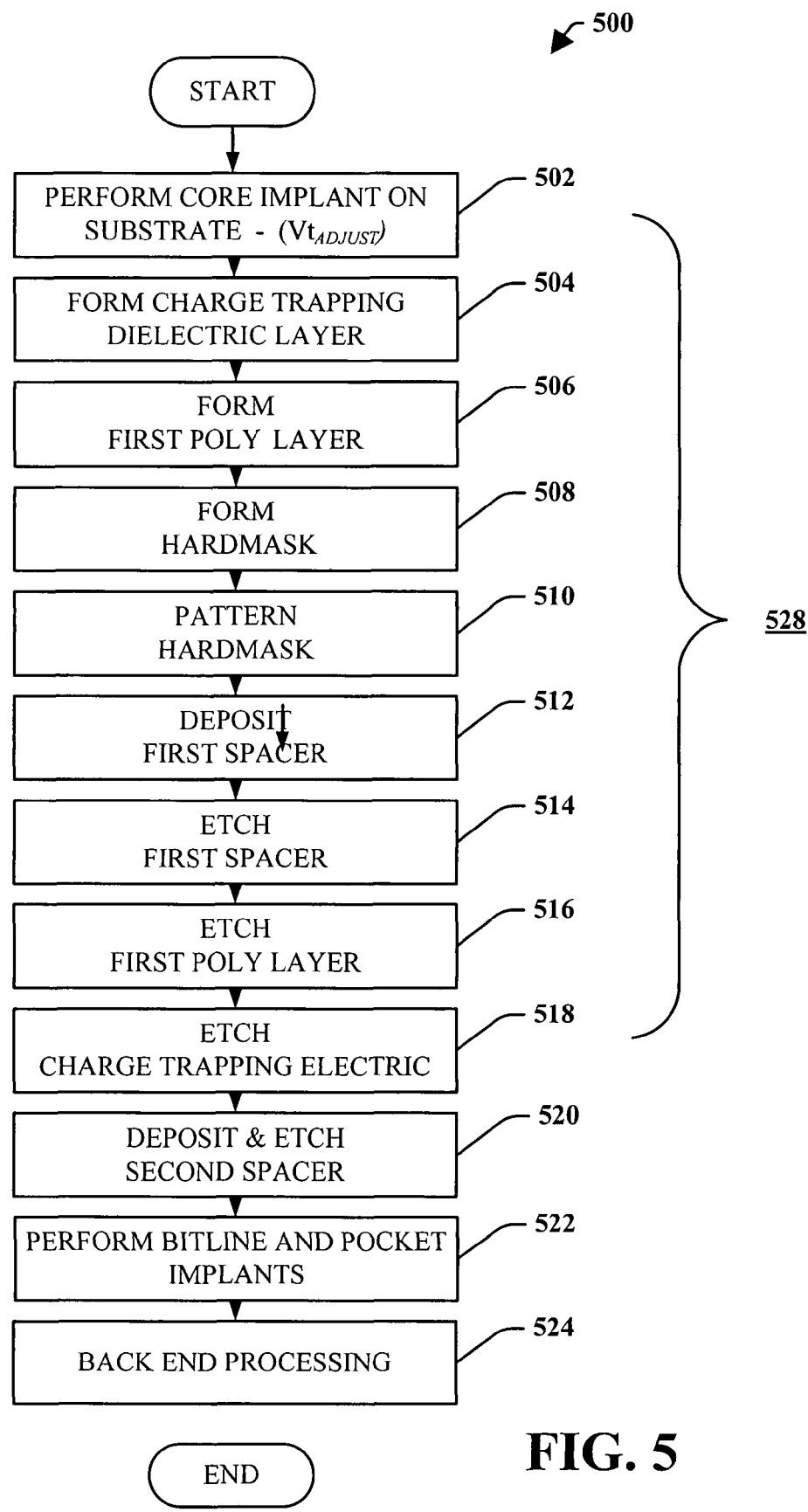
FIG. 5 is a flow diagram illustrating an example of a methodology for forming a memory device in accordance with one or more aspects of the present invention wherein thick (removable) spacers are employed to reduce bitline dimensions and increase breakdown threshold voltage.

Turning to FIG. 5, a methodology 500 is illustrated for forming a memory device according to one or more aspects of the present invention. In particular, the memory is formed with a dual poly process employing removable thick spacers to establish deeper and narrower buried bitlines with oxide materials formed there-over to enhance a breakdown voltage between bitlines and wordlines, lessen punch through currents, diminish cross-talk, mitigate Vt roll-off and facilitate increased packing density. The memory device so formed may, for example, correspond to a portion of a memory core such as may include at least part of one of the M by N array cores depicted in FIG. 1.

Although the methodology 500 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

It will be appreciated that a methodology carried out according to one or more aspects of the present invention may be implemented in association with the formation and/or processing of structures illustrated and described herein as well as in association with other structures not illustrated or described herein. By way of example, the method or variants thereof may be used to fabricate a dual bit memory as illustrated and described below with respect to FIGS. 6-24, as well as to devices not shown or described herein.

The memory is formed upon a semiconductor substrate at 502, and a threshold adjustment core implant $V_{tadjust}$ is performed to establish a region of the substrate that is more heavily doped than the remainder of the semiconductor substrate. The substrate can, for example, be formed out of silicon and can itself be doped with a p-type impurity such as boron, for example. The threshold adjustment implant may include a greater concentration of and/or a higher energy implant of the same or different p-type dopant utilized in the rest of the substrate, for example, and assists in controlling a threshold voltage of the memory cell.

At 504 a charge trapping dielectric layer is formed over the semiconductor substrate. The charge trapping dielectric layer may be a multilayer material that may include a first insulating layer, a charge-trapping layer, and a second insulating layer. The first and second insulating layers may be formed of an oxide dielectric such as silicon dioxide ($SiO_2$), for example. The first insulating layer can be formed to a thickness of about 70 Angstroms or less, for example, while the second insulating layer can be formed to a thickness of about 100 Angstroms or less, for example. The charge-trapping layer may be formed of a nitride dielectric such as silicon nitride ($Si_xN_y$), for example, and may be formed to a thickness between about 60 to 80 Angstroms, for example. The oxide-nitride-oxide configuration is commonly referred to as an ONO layer for convenience. Alternatively, poly-islands or other types of charge trapping dielectrics may be formed in accordance with one or more aspects of the present invention.

A first layer of poly(polysilicon) based material(s) is then formed over the charge trapping dielectric layer at 506. This first poly layer can be formed to a thickness of between about 900 to 1100 Angstroms, for example. A layer of hardmask material is subsequently formed over the first poly layer at

508. An optional antireflective coating (ARC) layer (e.g., of an organic material, such as silicon nitride or silicon oxynitride) can also be formed over the hardmask, and a resist can be formed over the ARC layer to facilitate patterning the hardmask. The ARC layer in particular can assist with mitigating reflection during exposure and thereby improves the fidelity of pattern transfer. The hardmask can, for example, be formed from oxide based material(s) that are applied to a thickness of between about 300 to 700 Angstroms, for example.

The hardmask is then patterned at 510 (e.g., after both the resist and optional ARC layers have been patterned, exposed, etched and/or selectively stripped to form a combined photomask for transferring the pattern onto the hardmask). The patterned features formed (e.g., etched) within the hardmask correspond, at least partially, to buried bitlines which will be formed within the substrate. More particularly, respective spacings between the features correspond somewhat to buried bitlines that will be implanted within the substrate. The spacings within the hardmask can be formed to have respective widths of between about 100 to 140 nanometers, for example.

At 512 a first layer of spacer material (e.g., oxide based materials) is deposited over the patterned hardmask. The first spacer material can be deposited to a thickness of between about 200 to 500 Angstroms, for example, and is utilized to form first spacers that assist with establishing narrower buried bitlines. This can be, for example, an isotropic deposition, wherein the first layer grows on both the vertical and horizontal surfaces. As such, the first spacer material is subsequently patterned or plasma etched (e.g., isotropically etched) at 514 to form sidewall spacers adjacent the patterned features of the hardmask, thereby reducing respective spacings between the hardmask features with precision. The spacers can be formed to have respective widths of between about 20 to 40 nanometers, for example. The distance between the first spacers defines somewhat respective bitline openings having widths somewhere in the neighborhood of around 55 to 85 nanometers, for example. It will be appreciated that should an ARC (antireflective coating) layer be utilized in patterning the hardmask, the ARC layer would also be patterned and would add to the thickness of the oxide sidewall first spacers and would contribute to narrowing the respective bitline openings. The etched first spacer forms a mask for the first poly layer at step 514 of method 500.

At step 516 the first poly layer is then plasma etched and the sidewall spacers serve as guides and as such, spacings formed within the first poly layer have respective widths corresponding somewhat to that of the bitline openings. The plasma etch is an anisotropic process and in this case it etches in the vertical direction only. This degree of accuracy is not possible with photolithography wherein light diffraction limits the process. In addition a wet etch is an isotropic (equally in all directions) process and therefore not as accurate as the plasma etch employed herein. The charge trapping dielectric layer is similarly plasma etched at step 518 to include spacings having respective widths corresponding to that of the bitline openings. The charge trapping dielectric layer (e.g., ONO) is etched away to expose the silicone for a high energy implant utilizing, for example, arsenic. Without etching the ONO layer the arsenic would have to be implanted at a high energy through the ONO layer, which can cause damage in the ONO layer. This could negatively impact the breakdown voltage and reduce it to a level that would necessitate repairing the ONO layer, for example.

It will be appreciated that the etchants utilized to remove the first and second dielectric layers of the ONO layer are also effective to remove the patterned hardmask features and the sidewall spacers since these features contain the same or a similar type of compound, namely an oxide. Should some traces of the hardmask features remain, these can be stripped or washed away at a later appropriate time. It is also to be appreciated that steps 502 through 518 can be carried out in a variety of ways and can be referred to jointly as a first memory cell process assembly 528.

At 520 according to an embodiment of the present invention, the first poly layer is cut and a second spacer material is then formed over the first poly layer and the charge trapping dielectric layer features that can be, a thick oxide, for example, greater than 10 nanometers. The second spacer material at 520 is plasma etched, for example, to form a second spacer. The role of the second spacer is to reduce the distance between the first poly layer features, for example, so that a narrower junction can be made in the substrate, while at the same time keeping the same short channel characteristics, for example, center to center bitline spacing.

Bitline implants and pocket implants are then performed at 522 to establish the buried bitlines within the exposed semiconductor substrate. The bitline implant can include an n-type dopant, such as arsenic, for example. Since the second spacer has been added; and the first poly layer and the charge trapping dielectric ONO layer have been removed the implant can be performed at relatively high energy levels of around 10 to 40 KeV, for example, as compared to conventional high implant energies of around 10 KeV.

Similarly, the bitlines can be formed to relatively deep depths of about 50 Angstroms, for example, as compared to conventional depths of around 90 Angstroms. Additionally, the bitline implant may be performed at a dosage of about $1E15/cm^2$ for a resulting concentration of about $2E20/cm^3$, for example. The first poly, the second spacer and the ONO layers block the implant. Accordingly, the bitlines are formed to a width corresponding substantially to that of the bitline openings. In one example, the bitlines are formed to a width of about 80 nanometers.

The methodology 500 advances to 524, and ends thereafter, wherein further back end processing can be performed at 524, such as the formation and/or patterning of one or more additional conductive and/or non-conductive layers and/or implantations. For example, at step 524 of method 500 the bitline and pocket implants can be done prior to removing the damaged second spacer, for example, using etchants well known by those skilled in the art. A high temperature oxide deposition can then performed, in addition, at 524 to fill in the respective spacings formed within the charge trapping dielectric layer. The high temperature oxide deposition can be performed at temperatures between around 200 to 1200 degrees Celsius, for example. The high temperature oxide deposition causes oxide growth over the respective bitlines while also depositing oxide over the buried bitlines. In one example, about 100 Angstroms of an oxide is grown, while an additional approximately 100 Angstroms of an oxide is deposited over the bitlines.

Still at step 524 a high density plasma (HDP) deposition can then performed to fill in the respective spacings formed within the first poly layer with an oxide material. The HDP deposition can, for example, be performed at a temperature of about 300 C to about 700 C under a pressure of about 1-10 mTorr to fill in the first poly spacings. The entire wafer can then subjected to chemical mechanical polishing (CMP) at 524 to remove any excess oxide and planarize the surface of the structures thereon.

A second layer of poly based material(s) can then be formed over the first poly layer. As with the first poly layer, the second poly layer can be formed to thickness of between about 900 to 1100 Angstroms, for example. The second poly layer serves as a wordline material and as such can be patterned into wordlines. Accordingly, the second poly layer can be patterned to establish wordlines over the buried bitlines (e.g., at a substantially 90 degree orientation). It is to be appreciated by one skilled in the art that the back end processing can be carried out in many ways or variations.

Figure 6:
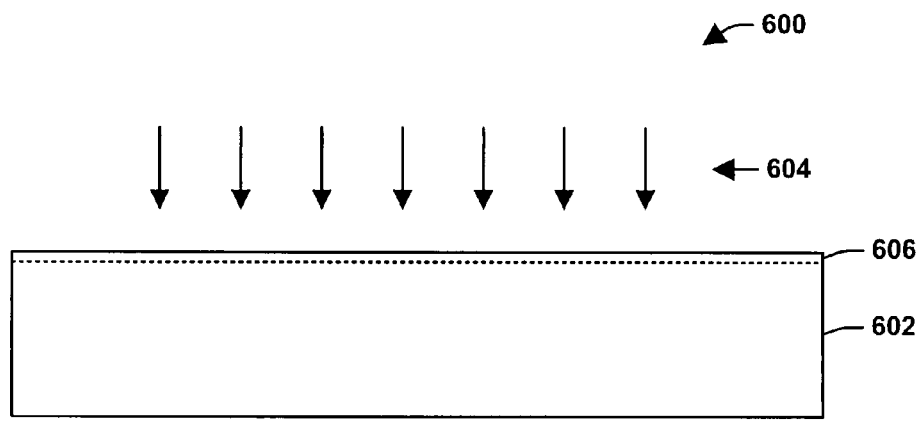
FIGS. 6-23 are cross-sectional illustrations of memory formed according to one or more aspects of the present invention.

Turning now to FIGS. 6-24, an exemplary technique for forming a memory device 600 according to one or more aspects of the present invention is disclosed (FIG. 6). In particular, the memory 600 is formed utilizing dual poly layers and oxide applications to reduce the width of buried bitlines and improve breakdown and/or threshold voltage Vt. The heretofore unfeasible reduced bitline dimensions facilitate scaling and increased packing density. The memory device 600 so formed may, for example, correspond to a portion of a memory core such as may include at least part of one of the M by N array cores depicted in FIG. 1.

Initially, a semiconductor substrate 602 upon which the memory is formed is subjected to a threshold adjustment core implantation 604 to establish a region 606 of the substrate 602 that is more heavily doped than the remainder of the semiconductor substrate as illustrated in FIG. 6. The substrate may itself be doped with a p-type dopant such as boron, for example, and the threshold adjustment implant ($V_{tadjust}$) may include a greater concentration of and/or a higher energy implant of the same or different p-type dopant, for example. The threshold adjustment core implantation 604 assists in controlling a threshold voltage of the memory device 600. The threshold adjustment core implantation 604, however, is optional and may be skipped in accordance with the present invention, for example.

It is to be appreciated that reference to substrate 602 or semiconductor substrate 602 as used herein can include a base semiconductor wafer (e.g., silicon, SiGe, or an SOI wafer) and any epitaxial layers or other type semiconductor layers formed thereover or associated therewith. It is to be further appreciated that elements depicted herein are illustrated with particular dimensions relative to one another (e.g., layer to layer dimensions and/or orientations) for purposes of simplicity and ease of understanding, and that actual dimensions of the elements may differ substantially from that illustrated herein.

Figure 7:
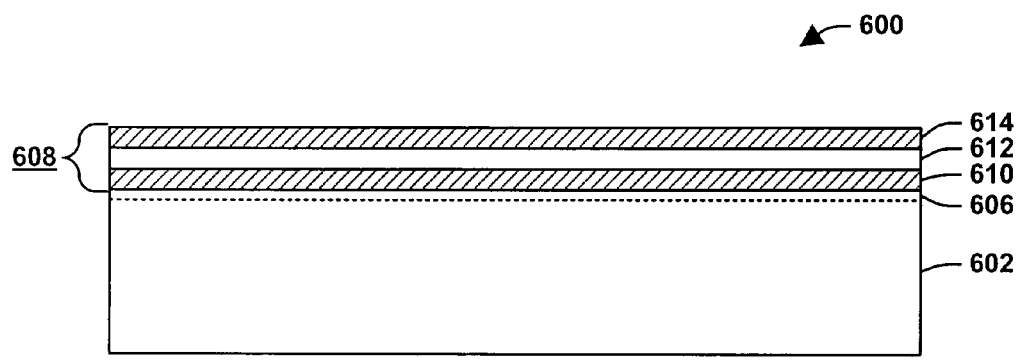

A charge trapping dielectric layer 608 is then formed over the semiconductor substrate 602 (FIG. 7). In the example shown, the charge trapping dielectric layer 608 includes a first insulating layer 610, a charge trapping layer 612 and a second insulating layer 614. The first insulating layer 610 can be formed to a thickness of about 70 Angstroms or less, for example, while the second insulating layer 614 can be formed to a thickness of about 100 Angstroms or less, for example. The first and second insulating layers, 610 and 614 respectively, can include, for example, silicon dioxide. The charge-trapping layer 612 may be formed of a nitride dielectric such as silicon nitride ($Si_xN_y$), for example, and may be formed to a thickness between about 60 to 80 Angstroms, for example. The oxide-nitride-oxide configuration is commonly referred to as an ONO layer for convenience. Alternatively, poly-islands or other types of charge trapping dielectrics may be formed in accordance with one or more aspects of the present invention.

Figure 8:
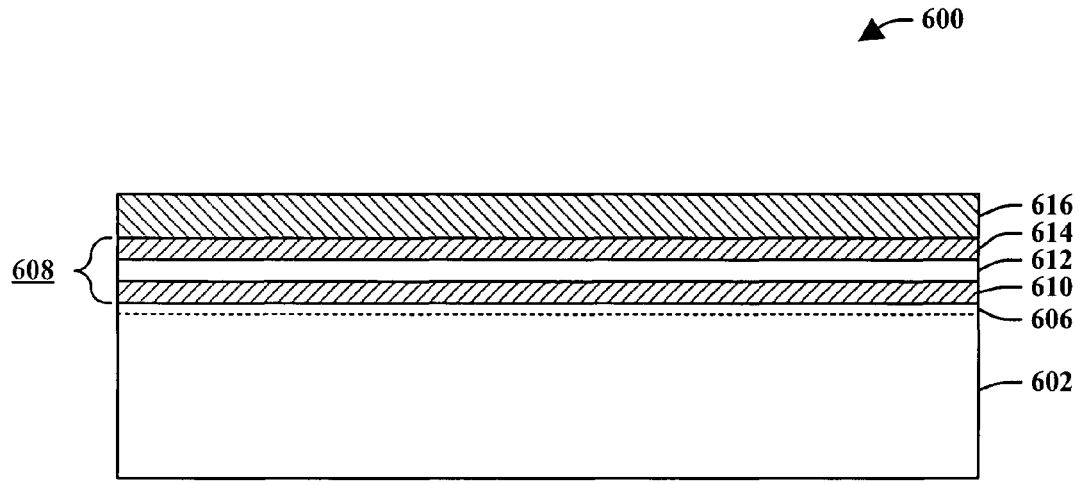
Figure 9:
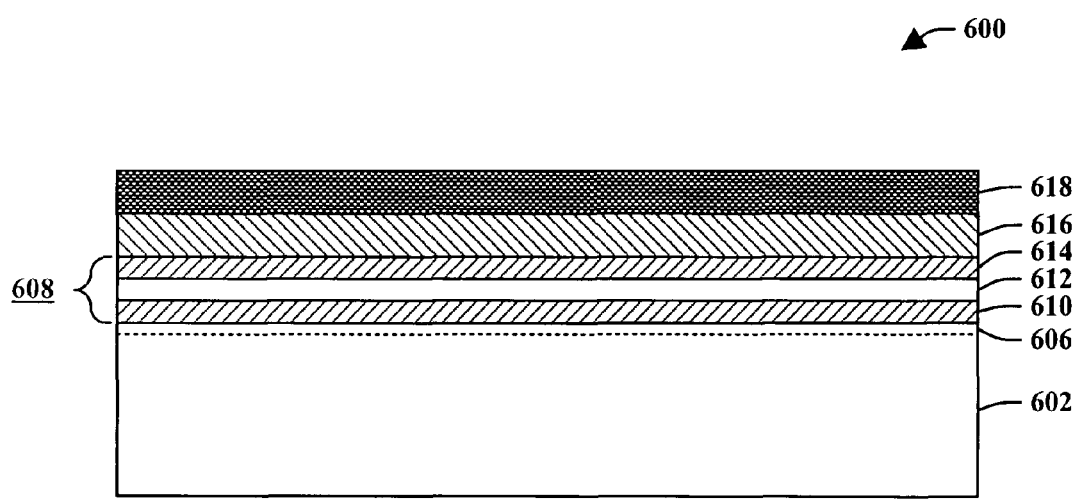

A first poly layer of polysilicon based material(s) 616 is then formed over the charge trapping dielectric layer 608 (FIG. 8). This first poly layer 616 can be formed to a thickness of between about 500 to 1100 Angstroms, for example. A layer of hardmask material 618 is subsequently formed over the first poly layer 616 (FIG. 9). An optional antireflective coating (ARC) layer (not shown), that may include an organic material, such as silicon nitride or silicon oxynitride, for example, can be formed over the hardmask 618, and a resist (also not shown) can be formed over the ARC layer to facilitate patterning the hardmask 618. The ARC layer in particular assists with mitigating reflection during exposure and thereby improves the fidelity of pattern transfer. The hardmask 618 can, for example, be formed from oxide based material(s) that are applied to a thickness of between about 300 to 700 Angstroms, for example.

Figure 10:
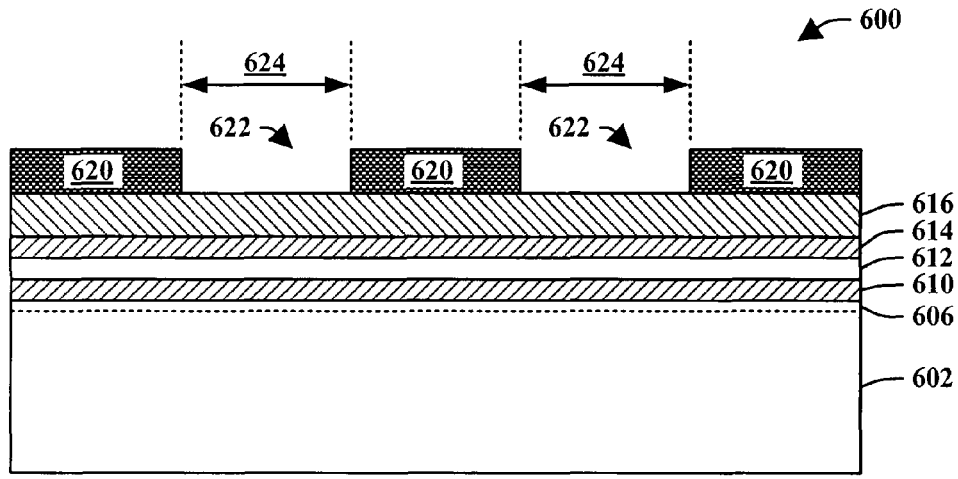

The hardmask 618 is then patterned (e.g., after both the resist and optional ARC layers have been patterned, exposed, etched and/or selectively stripped to form a combined photomask for transferring the pattern onto the hardmask) (FIG. 10). The resulting hardmask features 620 formed (e.g., etched) from the hardmask 618 correspond, at least partially, to buried bitlines which will be formed within the substrate 602. More particularly, respective first spacings 622 between the features 620 correspond somewhat to buried bitlines that will be implanted within the substrate 602. The first spacings 622 within the hardmask 618 can be formed to have respective first widths 624 of between about 100 to 140 nanometers, for example.

Figure 11:
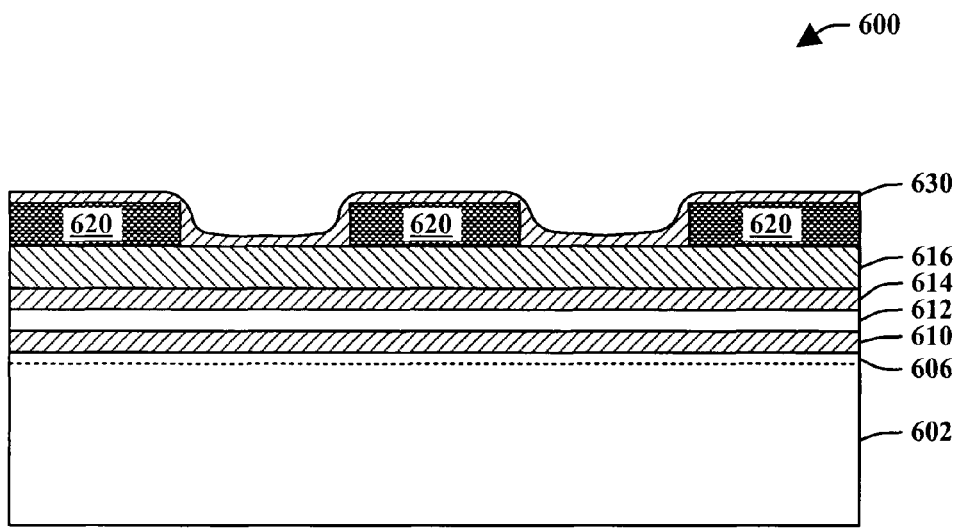
Figure 12:
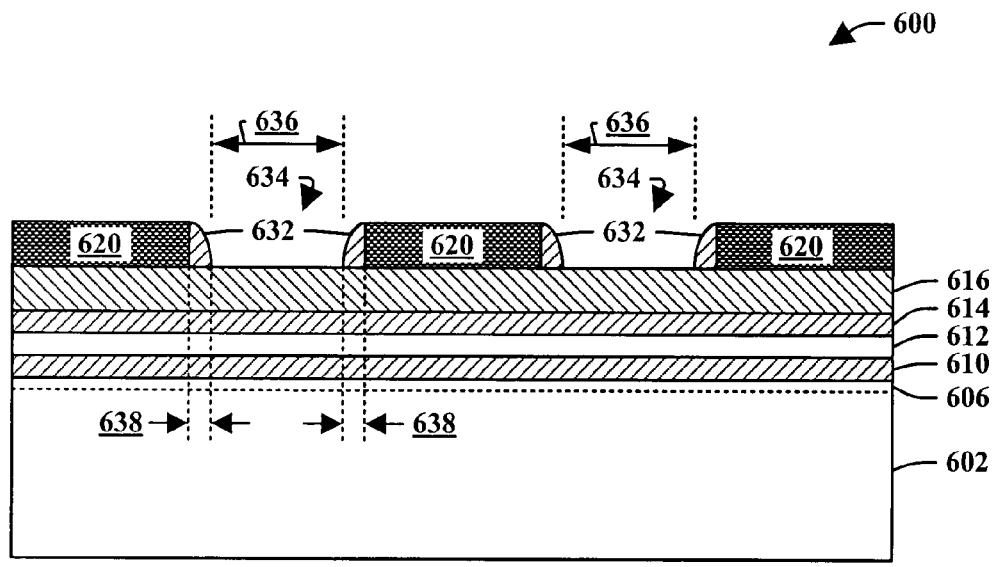

A first spacer material 630 (e.g., of oxide and/or nitride based material) is then formed over the patterned hardmask features 620 and exposed portions of the first poly layer 616 (FIG. 11). The first spacer material 630 can be formed to a thickness of between about 200 to 500 Angstroms, for example, and is utilized to form spacers that assist with establishing narrower buried bitlines. As such, the first spacer material 630 is then patterned (e.g., isotropically plasma etched) to form first layer sidewall spacers 632 adjacent to the patterned features 620 of the hardmask (FIG. 12). The distance between the first layer sidewall spacers 632 defines respective second spacings 634 having second widths 636 somewhere in the neighborhood of around 55 to 85 nanometers, for example. The sidewall spacers can have respective second widths 636 (FIG. 12) of between about 20 to 80 nanometers, for example. It will be appreciated that should an ARC layer be utilized in patterning the hardmask 618, the ARC layer would also be patterned and would add to the thickness of the first layer sidewall spacers 632 and thus would contribute to narrowing the respective second spacings 634.

Figure 13:
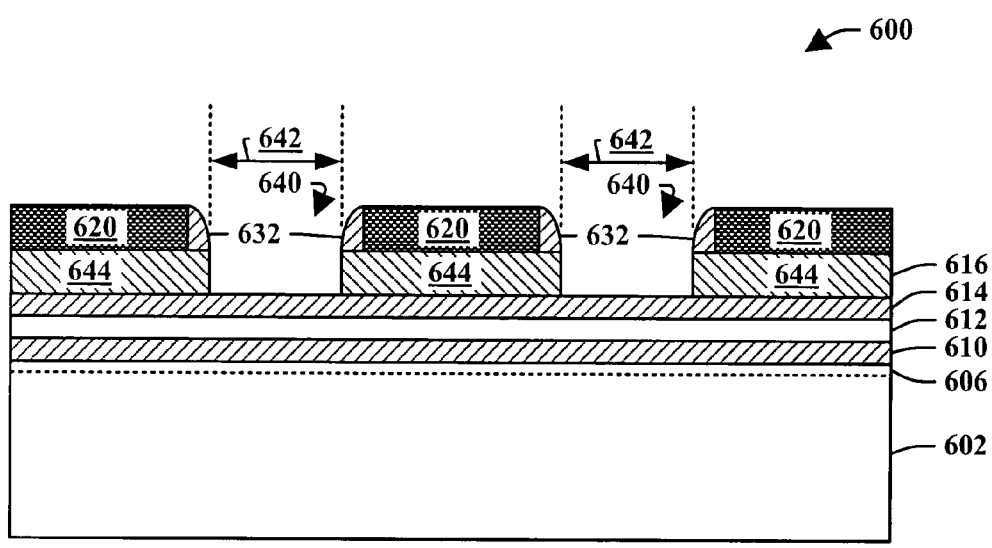
Figure 14:
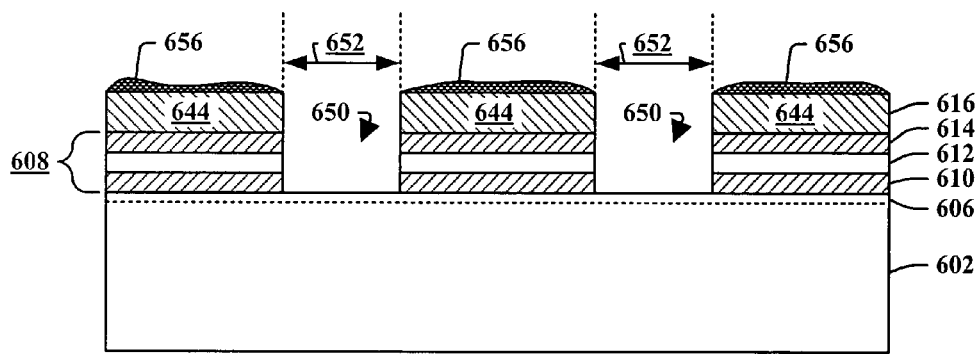
Figure 15A:
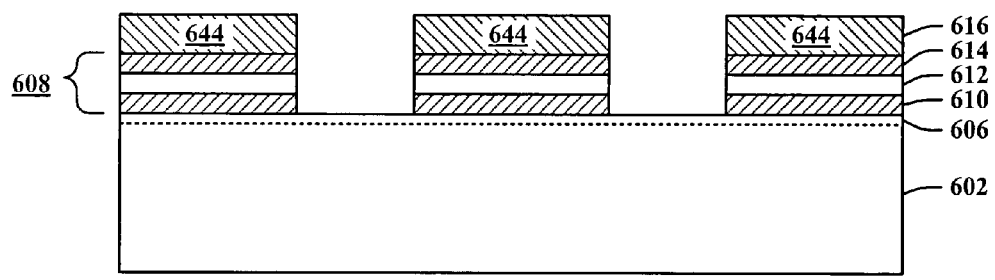
Figure 15B:
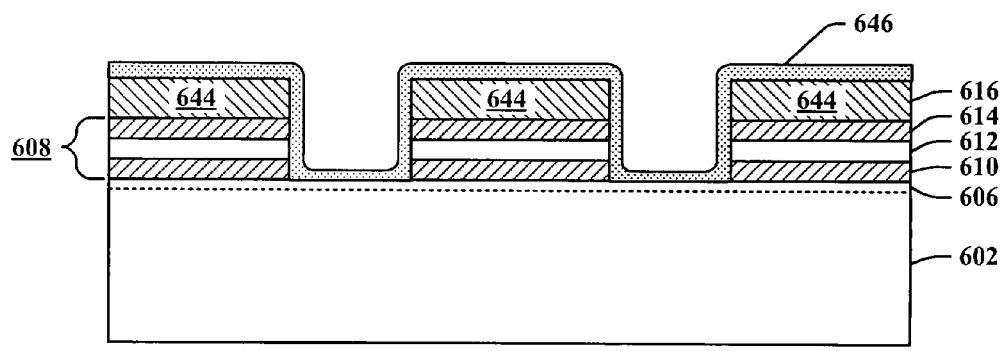

The first poly layer 616 is then patterned with the first layer sidewall spacers 632 serving as guides (FIG. 13). As such, third spacings 640 formed within the first poly layer 616 have respective third widths 642 corresponding to the second widths 636 of the bitline openings 634 (FIG. 12). It will be appreciated that in a three dimensional perspective the first poly layer 616 is patterned into parallel "strips" 644 of first poly material 616. The charge trapping dielectric layer 608 is similarly patterned (FIG. 14) to include forth spacings 650 having respective forth widths 652 also corresponding to that second widths 636 of the second spacings 634 (FIG. 12). It will be appreciated that the etchants utilized to remove the first 610 and second 614 dielectric layers are also effective to remove the patterned hardmask features 620 and the sidewall spacers 632 (FIG. 13) since these features contain the same or a similar type of compound, namely oxide based materials. Should some traces 656 of the hardmask features remain, these can be stripped or washed away at a later time to reveal a clean patterned first poly layer 616 (FIG. 15A).

Figure 15C:
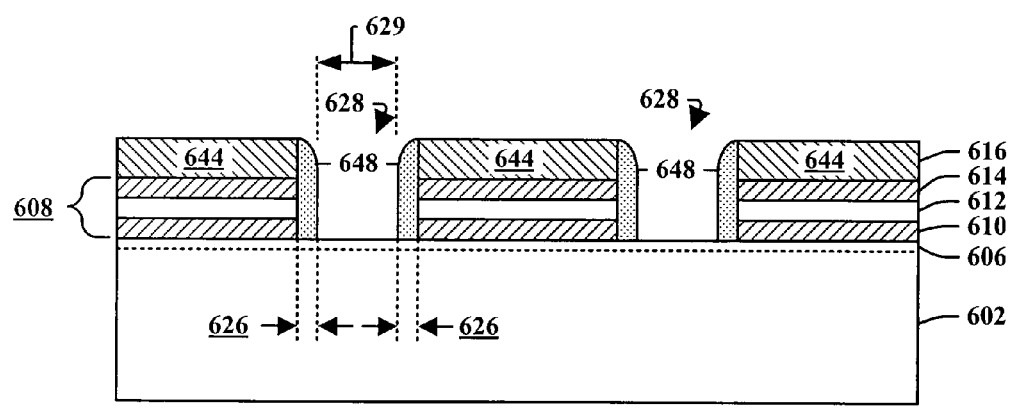

A second spacer material 646 (e.g., of oxide and/or nitride based material) is then formed over the patterned ONO features and exposed patterned portions or features of the first poly layer 644 (FIG. 15B), according to at least one aspect of the present invention. The second spacer material 646 can be formed to a thickness of between about 50 to 500 Angstroms, for example, and is employed to shape spacers that assist with establishing narrower buried bitlines. As such, according to another aspect of the present invention, the second spacer material 646 is then patterned (e.g., isotropically plasma etched) to form second layer sidewall spacers 648 adjacent to the patterned features of the ONO layer and patterned first poly layer 644 (FIG. 15C). The distance between the second layer sidewall spacers 648 defines respective fifth spacings 628 having fifth widths 629 somewhere in the neighborhood of around 45 to 85 nanometers, for example. The sidewall spacers can have respective fifth widths 629 (FIG. 15C) of between about 5 to 60 nanometers, for example.

Figure 16A:
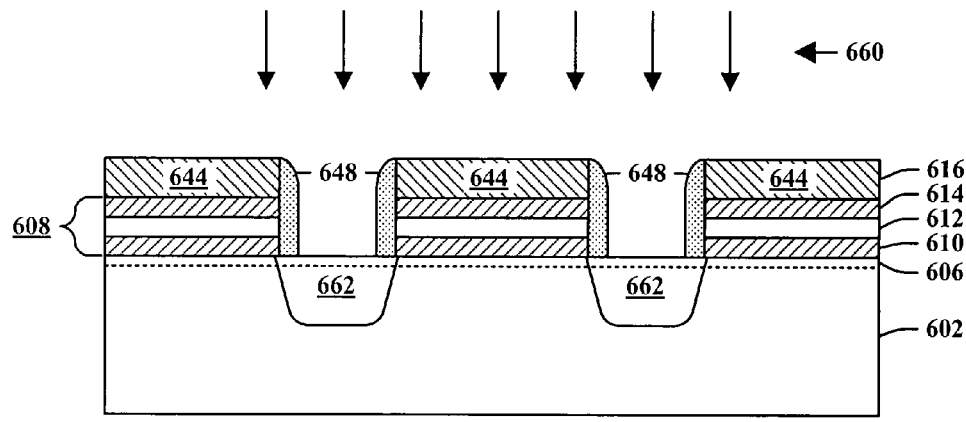

According to yet another aspect of the present invention, a bitline implant 660 is then performed to establish the buried bitlines 662 within the semiconductor substrate 602 (FIG. 16A). The bitline implant 660 can include an n-type dopant, such as arsenic, for example. Since the first poly layer 616 and the charge trapping dielectric ONO layer 608 have been patterned with a second spacer 648, the implant can be performed at relatively energy levels of around 5-40 KeV, for example, as compared to conventional higher implant energies of 40 KeV or greater. This resultantly reduces the resources required for and costs associated with forming memory devices, among other things as the bitlines can be implanted to a greater depth without causing greater diffusion thus reducing the likelihood of breakthrough currents or breakdown voltages.

Figure 16B:
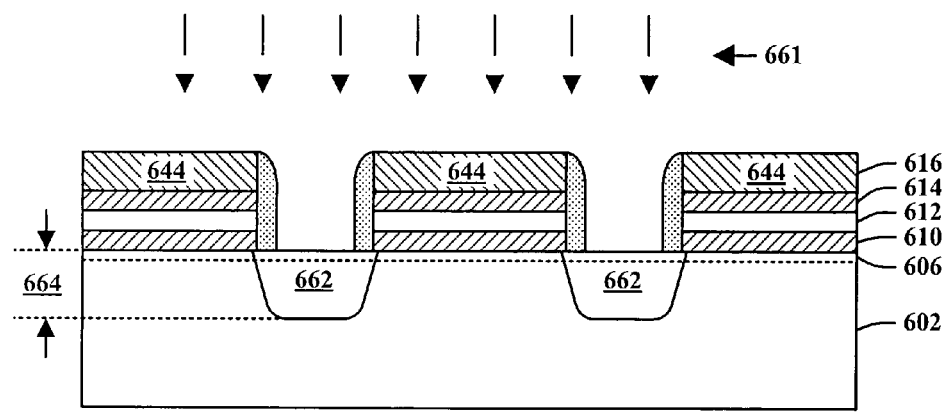
Figure 16C:
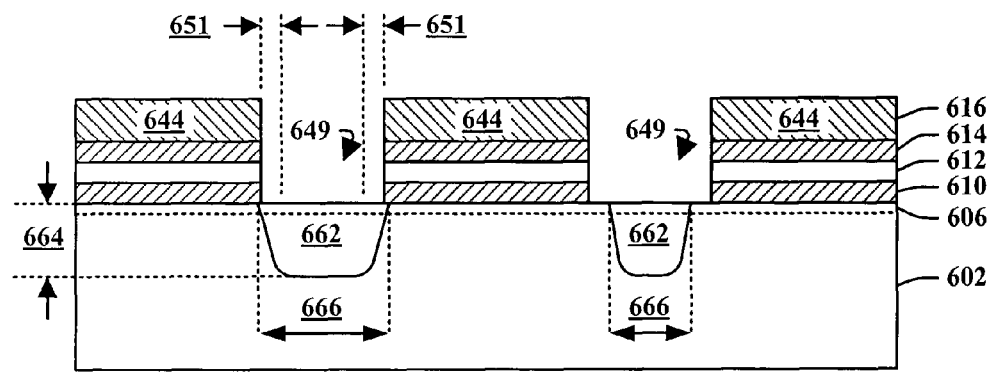

According to another aspect of the present invention, the bitlines 662 can be formed to relatively high depths 664 of about 50-100 nanometers, for example, as compared to conventional depths of around 50 (FIG. 16B). Additionally, the bitline implant may be performed at a dosage of about $1E15/cm^2$ for a resulting concentration of about $2E20/cm^3$, for example. The first poly 616 and ONO 608 layers block the implant 660, and the bitlines 662 are accordingly formed to a width 666 that corresponds substantially to that 636 of the bitline openings 634. This width 666 can be about 80 nanometers, for example, and is substantially less than that 426 of conventionally implanted bitlines 412 (FIG. 4) due, at least in part, to the use of the second sidewall spacers 648 (FIG. 16A).

Additionally a pocket implant 661, according to another aspect of the present invention, can be performed with the same second sidewall spacers 648 into the bulk substrate 602. The pocket implant 661 can increase the device Vt and roll off short channel effect. It should be appreciated by one skilled in the art that the optional pocket implant 661 can be done before the spacers 648 are created so that the bitline implant 600 and the pocket implant 661 are offset, for example. The second sidewall spacers 648 can be, for example, damaged by the high dose bitline implant 660 are removed leaving sixth spacings 649 (FIG. 16C), leaving a bitline to edge gap 651 between the edge of the ONO layer and the edge of the bitline, as shown.

Figure 17:
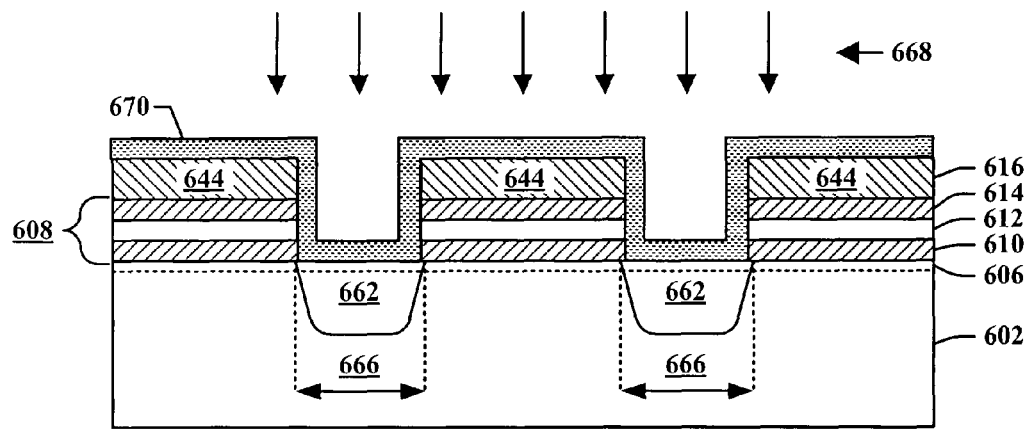

A high temperature oxide deposition 668 can then be performed with an oxide based material 670 (FIG. 17). The high temperature oxide deposition can be performed at temperatures between around 700 to 1200 degrees Celsius, for example. The high temperature oxide deposition deposits oxide over the respective bitlines 662 while also depositing oxide over the exposed charge trapping dielectric layer 608. In one example, about 100 Angstroms of an oxide is deposited over the bitlines 662.

Figure 18:
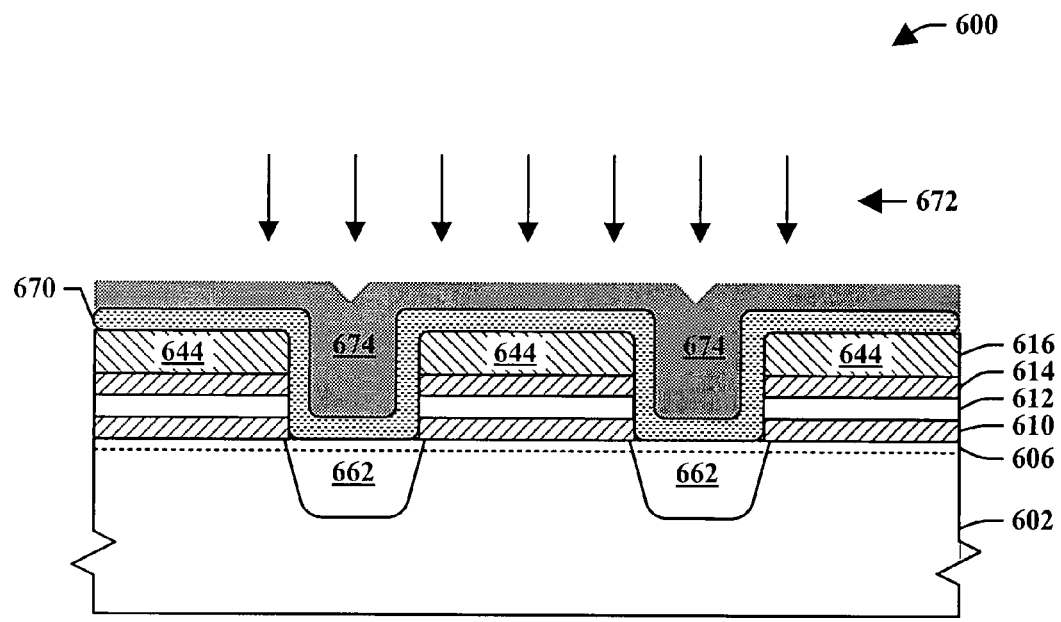
Figure 19:
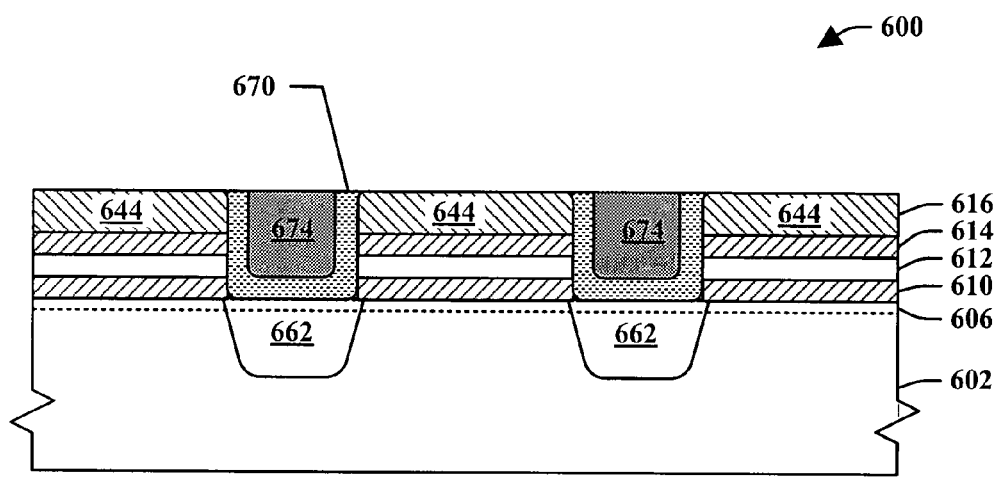

A high density plasma (HDP) deposition 672 is then performed to fill the openings within the memory device 600 formed within the first poly layer 616 with an oxide material 674 (FIG. 18). The HDP deposition 672 can, for example, be performed at a temperature of about 300 C to about 700 C and under a pressure of about 1-10 mTorr to fill in the first poly spacings 640. The entire wafer is then subjected to chemical mechanical polishing (CMP) to remove any excess oxide material 674 and planarize the surface of the structures thereon (FIG. 19). It will be appreciated that in a three dimensional perspective this results in "strips" of oxide material 674 in parallel with the patterned strips 644 of the first poly material 616.

A second layer of poly based material(s) 676 can then be formed over the first poly layer 616 (FIG. 20), for example. As with the first poly layer 616, this second poly layer 676 can be formed to thickness of between about 900 to 1100 Angstroms, for example. The second poly layer 676 serves as a wordline material and as such can be patterned into wordlines. Accordingly, the second poly layer 676 is then patterned to establish wordlines 678 over the buried bitlines 662 (FIG. 21). It will be appreciated that the wordlines 678 are formed so as to be oriented at approximately 90 degrees relative to the bitlines 662. This "crossed" orientation allows individual memory cells to be addressed. The illustration depicted in FIG. 21 is accordingly rotated approximately 90 degrees relative to the images illustrated in FIGS. 6-20. As such, a side view or view along the length of a buried bitline 662 is illustrated in FIG. 21. FIG. 21 can also be thought of as a view into FIG. 20 along lines 21-21 with the second poly layer 676 patterned into the wordlines 678.

It will be appreciated that since the buried bitlines 662 are substantially parallel to the "strips" 644 of the patterned first poly layer 616 as well as the "strips" 674 of oxide material deposited between strips 644, the patterned wordlines 678 are also substantially perpendicular to strips 644, 674. Accordingly, since the wordlines 678 lie immediately over these strips 644, 674, the wordlines may be shorted together by the underlying strips 644 of the patterned first poly layer 616 if these strips 644 are not patterned so as to electrically isolate the overlying wordlines 678 from one another. As such, when the second poly layer 676 is patterned to form the wordlines 678, this process continues until underlying portions of the strips 644 between the wordlines 678 are also removed (e.g., to expose the second insulating layer 614). Accordingly, the portions of the strip of oxide material 674a visible in FIG. 21 is revealed by the removed portions of the strip 644a of the first poly layer 616. As such, these visible portions of strip 674a are actually set back from the remaining portions of strip 644a by a distance substantially equal to the width 690 of strip 644a (FIG. 20).

Figure 20:
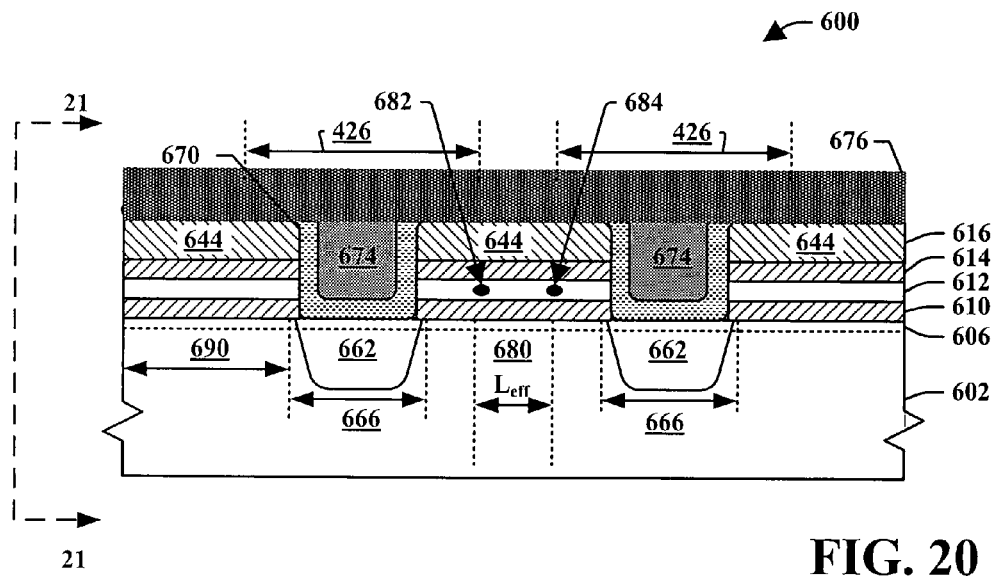
Figure 21:
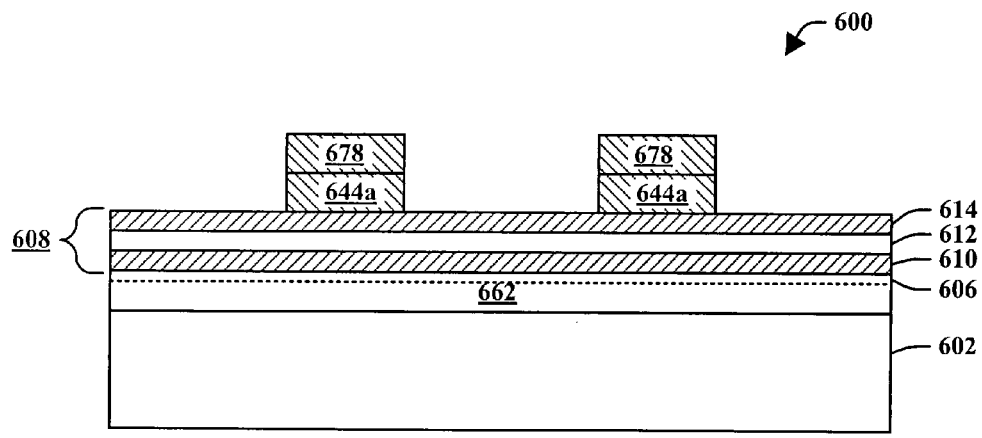

Referring to FIG. 20, it will be appreciated that the buried bitlines 662 serve as source and drain regions of the transistor or memory cell 600, and a channel 680 is defined between these regions. The channel 680 underlies a gate of the transistor, where wordlines generally serve as the gates of transistors operating as memory devices. When a voltage of a sufficient magnitude (e.g., a threshold voltage (Vt)) is applied to the gate of the transistor, electric fields generated within the transistor allow currents to flow between the source and drain regions. This allows charges 682, 684 (which correspond to bits of data) to be stored (programmed) within and/or erased from the charge trapping layer 612. It will be appreciated that dual charges or bits are discussed herein as one or more aspects of the present invention have application to dual bit memory cells.

As scaling occurs, however, and channel lengths are correspondingly decreased, the threshold voltage Vt can change. For example, as source and drain regions are brought closer together, smaller and smaller voltages are needed to program and/or erase bits of data. This can promote Vt roll-off and lead to data being unintentionally erased and/or programmed. The narrower bitlines 662, however, serve to mitigate Vt roll-off, thereby providing more predictability as to when data will be programmed and/or erased from the cell 600. Additionally, the oxide regions 670, 674 overlying the bitlines 662 serve to maintain and/or increase a breakdown voltage between the bitlines 662 and the wordlines 678 (e.g., from a more conventional 16V to around 25V). In this manner the transistor 600 exhibits more predictable performance as compared to conventional devices.

Figure 22:
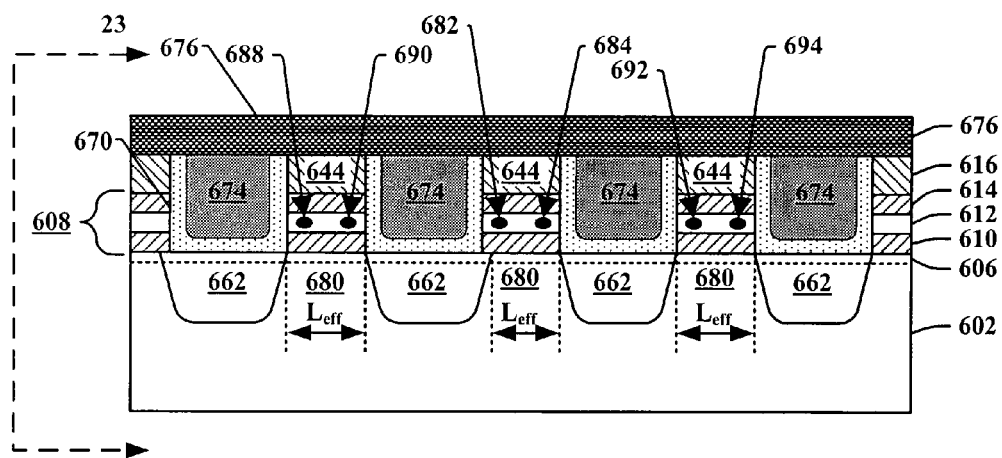

Further, the second sidewall spacers 648 allow the respective bitlines to be reduced from a conventional width 426 (FIG. 4) to a second spacer narrower bitline width 666 (FIG. 16). The amount of reduction in bitline width effectively expands the length of the channel. However, for an acceptable Vt and for issues such as cross-talk, complimentary bit disturb (CBD), leakage currents, etc., to be adequately mitigated, a certain effective channel length ($L_{eff}$) merely needs to be maintained. The reduction in bitline width thus allows more bitlines 662 to be formed closer together in the same amount of space while preserving the effective channel length (FIG. 22). As such, more transistors/memory cells can be "packed" onto a semiconductor wafer or die. This facilitates more efficient storage of more (dual) bits of data, such as bits 682 & 684, 688 & 690, 692, 694 within the same or a smaller area. It will be appreciated that given the substantially perpendicular orientation between the bitlines and the wordlines, a view along the length of the wordline is depicted in FIG. 22.

Figure 23:
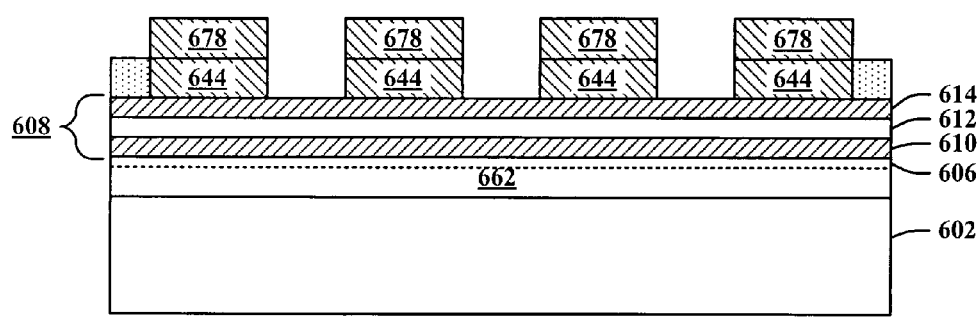
Figure 24:
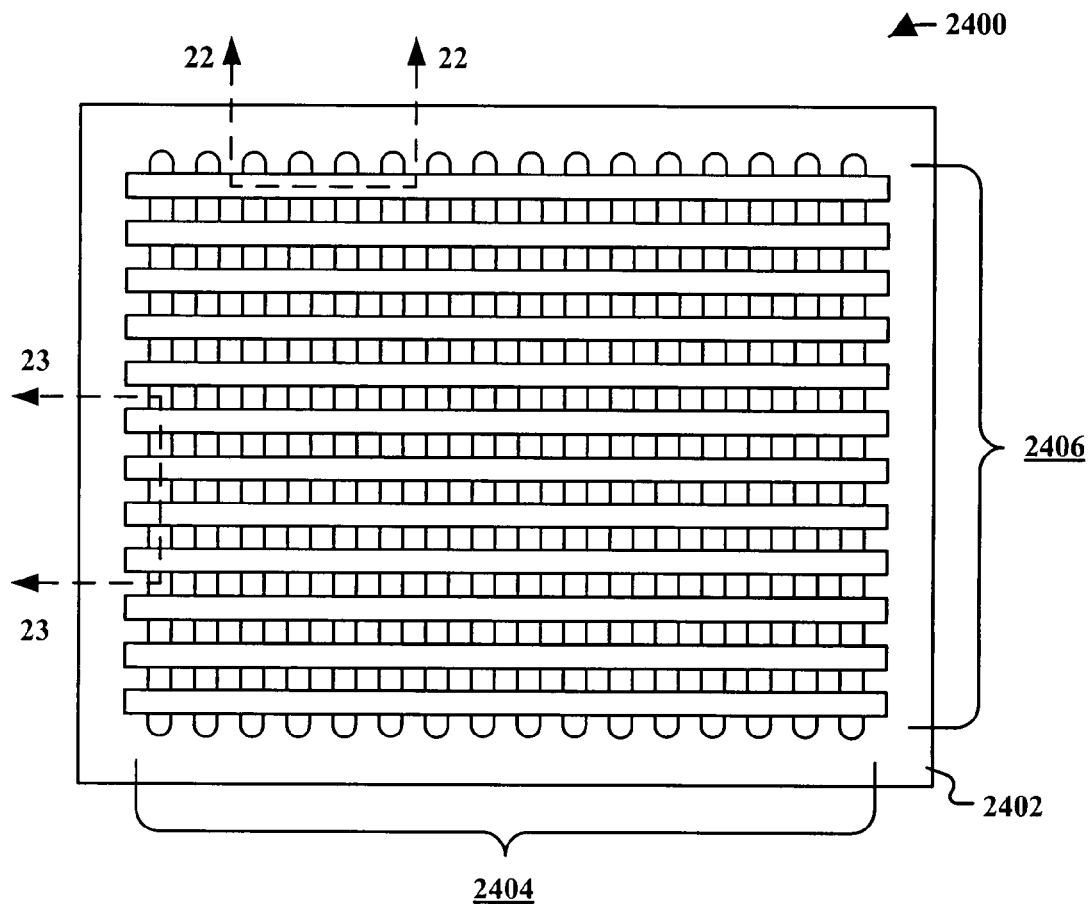
FIG. 24 is a top view of at least a portion of a memory core, similar to that depicted in FIG. 3, but representative instead to devices formed in accordance with one or more aspects of the present invention, such as those depicted in FIGS. 21 and 22.

FIG. 23 illustrates the patterned wordlines 678 in the "compressed" format set forth with respect to FIG. 22, but rotated by about ninety degrees or looking in lines 23-23 of FIG. 22. FIG. 23 is similar to FIG. 21 in that it illustrates the patterned wordlines 678 and is rotated by about 90 degrees relative to corresponding FIG. 22. However, the device depicted in FIG. 23 has more storage capability than the device of FIG. 21. Similarly, FIG. 24 is akin to FIG. 3 in that it illustrates a top view of at least a portion 2400 of a memory core, such as may include at least part of one of the M by N array cores 104 depicted in FIG. 1. Nevertheless, the memory 2400 is condensed in FIG. 24 in accordance with one or more aspects of the present invention.

The memory 2400 is formed upon a semiconductor substrate 2402 and has a plurality of implanted bitlines 2404 extending substantially parallel to one another, and further includes a plurality of wordlines 2406 formed over the buried bitlines 2404. The wordlines 2406 extend substantially parallel to one another and at substantially right angles relative to the plurality of implanted bitlines 2404. It will be appreciated that the wordlines 2406 and bitlines 2404 have contacts and interconnections (not shown) to programming circuitry such as may be represented, at least in part, by the x-decoders 108 and y-decoders 110 depicted in FIG. 1. It will also be appreciated that FIG. 22 may, for example, correspond to that which is depicted in FIG. 24 taken along lines 22-22, while FIG. 23 may correspond to that which is depicted in FIG. 24 taken along lines 23-23, for example.

It will be further appreciated that any of the layers described herein can be formed in any one or more suitable manners, either alone or in combination, such as with spin-on techniques, sputtering techniques (e.g., magnetron or ion beam sputtering), growth and/or deposition techniques such as chemical vapor deposition (CVD) and/or low pressure chemical vapor deposition (LPCVD), for example.

Figure 25:
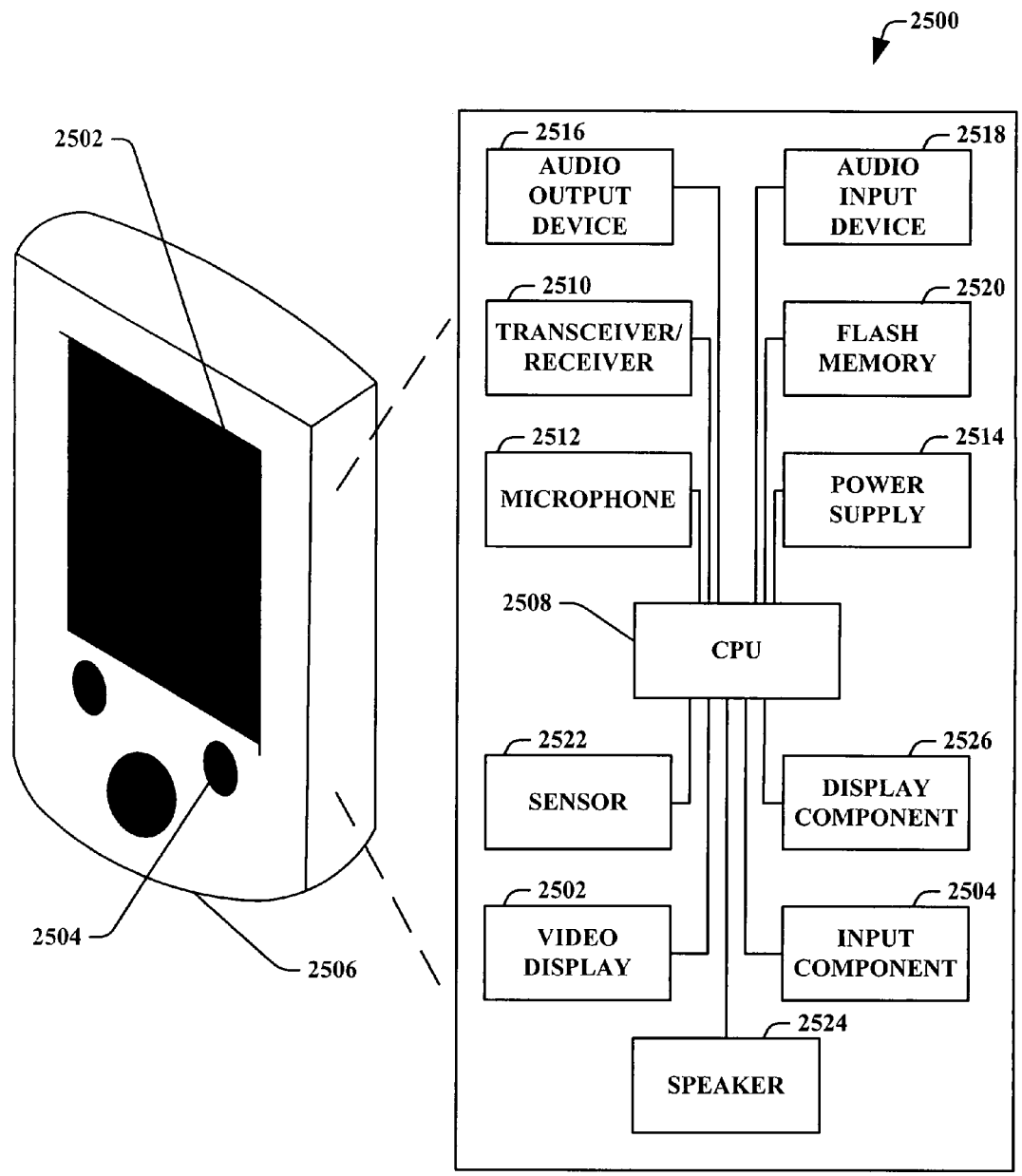
FIG. 25 is an isometric view of a device and block diagram according to yet one or more aspects of the present invention.

FIG. 25 is an exemplary portable electronic device, for example, a Personal Data Assistant (PDA) 2500 comprising a video display 2502, an input component 2504, a housing 2506, a CPU 2508, a transceiver and/or a receiver 2510, a microphone 2512, a power supply 2514, an audio output device 2516, an audio input 2518, flash memory 2520, various sensors 2522, and speaker(s) 2524. The flash memory 2520 manufactured according using a thick spacer for BL implant and then remove, of the present invention. The audio input device 2518 can be a transducer, for example. The input component 2504 can include a keypad, buttons, dials, pressure keys, and the like. The video display 2502 can be a liquid crystal display, a plasma display, an LED display, and the like, for displaying visual data and information. In accordance with another embodiment of the claimed subject matter, the portable device with flash memory 2520 manufactured according to a thick spacer for BL implant and then remove method, of the present invention, comprises cell phones, memory sticks, flash drive devices, video camcorders, voice recorders, USB flash drives, fax machines, flash memory laptops, MP3 players, digital cameras, home video game consoles, hard drives, memory cards (used as solid-state disks in laptops), and the like. The flash memory 2520 can include random access memory, read only memory, optical memory, audio memory, magnetic memory, and the like.

According to one embodiment of the present invention, the CPU 2508 is configured to communicate with the audio input device 2518, the audio output device 2516 and a display component 2526. The display component 2526 can be separate and distinct from the video display 2502. The CPU 2508 can execute control functions based on inputs from the user, entered using the input component 2504, for example. Based on those inputs, for example the display component can display a graph, a photo, a map, a chart, a video, and the like. The PDA 2500 is also configured to output data as an audio signal, for example a song, a message, a warning sound, various tones, recordings, etc. In another embodiment of the present invention the PDA 2500 can communicate with other electronic devices, for example computers, cell phones, other PDAs, and the like. The PDA 2500 is also configured to transmit digital data wirelessly from one user to another. This is done utilizing the transmitter/receiver 2510 to either transmit or receive data. Additionally, sensors 2522 can be utilized to sense data external to the PDA 2500, for example, temperatures, radiation levels, pressures, and the like Various techniques for designing and manufacturing portable flash memory electronic devices are well known by those of ordinary skill in the art and all are contemplated in the present invention. Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming at least a portion of a dual bit memory core array upon a semiconductor substrate, the method comprising:
   forming a charge trapping dielectric layer over the substrate;
   forming a first polysilicon layer over the charge trapping dielectric layer;
   forming a hardmask over the first polysilicon layer;
   patterning the hardmask to form hardmask features having first spacings having a first width therebetween;
   forming first sidewall spacers adjacent to the hardmask features, with respective pairs of sidewall spacers defining second spacings having a second width less than the first width therebetween;
   patterning the first polysilicon layer to form first polysilicon features defining third spacings having the second width therebetween;
   patterning the charge trapping dielectric layer to define fourth spacings having the second width therebetween;
   forming second sidewall spacers adjacent to the patterned charge trapping dielectric layer and the first polysilicon layer features to define fifth spacings having a third width therebetween that is less than the second width;
   performing bitline implants through the fifth spacings, to establish buried bitlines within the substrate having respective bitline widths corresponding to the third width;
   performing a pocket implant through the fifth spacings into the semiconductor substrate;
   removing the second sidewall spacers;
   performing a dielectric deposition to fill in spacings between the patterned charge trapping dielectric layer and first polysilicon features with one or more dielectric materials;
   performing a chemical mechanical polishing to remove excess dielectric based materials after performing the dielectric deposition;
   forming a second polysilicon layer over the first polysilicon features and the dielectric material disposed therebetween; and
   patterning the second polysilicon layer to form wordlines.

2. The method of claim 1, wherein the second sidewall spacers have respective widths of between about 5 to 60 nanometers.

3. The method of claim 1, wherein the fifth spacings have respective fifth spacing widths of between about 45 to 85 nanometers.

4. The method of claim 1, wherein the bitline implant includes an n-type dopant.

5. The method of claim 1, wherein the bitline implant is performed at an energy level of around 5 KeV to 40 KeV.

6. The method of claim 1, wherein the buried bitlines are formed to a depth of between about 500 to 1000 Angstroms.

7. The method of claim 1, wherein the bitline implant is performed at a dosage of about 1E15/cM2.

8. The method of claim 1, wherein the buried bitlines have a resulting dopant concentration of about $2E20/cm^3$.

9. The method of claim 1, wherein the buried bitlines are formed to a width of about 50-120 nanometers.

10. The method of claim 1, wherein performing a dielectric deposition comprises performing a high temperature oxide deposition at temperatures between around 700 to 1200 degrees Celsius.

11. The method of claim 10, wherein the high temperature oxide deposition results in about 100 Angstroms of oxide growth.

12. The method of claim 5, wherein performing the dielectric deposition further comprises performing a high density plasma oxide deposition after the high temperature oxide deposition at a temperature of about 300 C to about 700 C under a pressure of about 1-10 mTorr.

13. The method of claim 1, wherein the second polysilicon layer is formed to a thickness of between about 900 to 1100 Angstroms.

* * * * *